(12) United States Patent
Kim et al.

(10) Patent No.: US 8,513,996 B2
(45) Date of Patent: Aug. 20, 2013

(54) SEMICONDUCTOR MEMORY APPARATUS AND METHOD FOR CORRECTING DUTY THEREOF

(75) Inventors: Yong Hoon Kim, Ichon-si (KR); Chun Seok Jeong, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 124 days.

(21) Appl. No.: 13/166,051

(22) Filed: Jun. 22, 2011

(65) Prior Publication Data

US 2012/0194244 A1 Aug. 2, 2012

(30) Foreign Application Priority Data

Jan. 31, 2011 (KR) .................. 10-2011-0009804

(51) Int. Cl.
*H03K 3/017* (2006.01)
(52) U.S. Cl.
USPC .......................................... 327/175; 327/172

(58) Field of Classification Search
None
See application file for complete search history.

(56) References Cited

U.S. PATENT DOCUMENTS

| | | | | |
|---|---|---|---|---|
| 2009/0302912 A1* | 12/2009 | Lee | ................................. | 327/175 |
| 2010/0109725 A1* | 5/2010 | Yun et al. | ........................ | 327/158 |
| 2010/0164566 A1* | 7/2010 | Ku | ................................. | 327/149 |
| 2010/0289542 A1* | 11/2010 | Yun et al. | ........................ | 327/158 |

FOREIGN PATENT DOCUMENTS

KR 1020080088158 A 10/2008

* cited by examiner

*Primary Examiner* — Cassandra Cox
(74) *Attorney, Agent, or Firm* — William Park & Associates Patent Ltd.

(57) ABSTRACT

A semiconductor memory apparatus may comprise a duty cycle correction circuit configured to perform a duty correction operation with respect to an input clock signal when a delay locked signal is activated, and perform the duty correction operation with respect to the input signal when a precharge signal is activated, to generate a corrected clock signal.

23 Claims, 4 Drawing Sheets

SEMICONDUCTOR MEMORY APPARATUS AND METHOD FOR CORRECTING DUTY THEREOF

CROSS-REFERENCES TO RELATED APPLICATION

The present application claims priority under 35 U.S.C. §119(a) to Korean Application No. 10-2011-0009804, filed on Jan. 31, 2011, in the Korean Intellectual Property Office, which is incorporated herein by reference in its entirety as if set forth in full.

BACKGROUND

1. Technical Field

Various embodiments of the present invention relate to a semiconductor memory apparatuses and related methods. In particular, certain embodiments relate to a semiconductor memory apparatus including a duty cycle correction circuit and related method for correcting the duty cycle.

2. Related Art

A duty cycle correction circuit is extensively used to correct a duty of a clock generated in a delay locked loop of a semiconductor memory apparatus.

The delay locked loop receives an external clock signal, performs a delay locked operation with respect to the external clock signal to generate an internal clock signal, and generates a delay locked signal when a delay value for the internal clock signal is locked.

When the delay locked signal is activated, the duty cycle correction circuit receives the internal clock signal as an input clock signal, and performs a duty correction operation with respect to the input clock signal to generate a corrected clock signal.

Here, on the basis of a single cycle of a clock signal with a predetermined frequency, duty refers to a ratio of a time during which a clock signal is in a logic low state to a time during which the clock signal is in a logic high state. When the time during which the clock signal is in the logic low state is substantially same as the time during which the clock signal is in the logic high state, the duty is 50%.

In a conventional semiconductor memory apparatus, a delay locked loop and a duty cycle correction circuit can perform a delay locked operation and a duty correction operation with respect to a clock signal only when the semiconductor memory apparatus is initialized, in order to reduce current consumption in the delay locked operation and the duty correction operation during a read operation and a write operation.

After initialization, the conventional semiconductor memory apparatus may substantially maintain preset delay value and duty value without performing the delay locked operation and the duty correction operation. Thus, in the conventional semiconductor memory apparatus, the duty correction operation is started when the delay value of the delay locked loop is locked and repeated multiple times until the duty is corrected to be above a predetermined level. When the duty is corrected to be above the predetermined level, the set duty value is maintained and various duty correction operations are stopped.

However, if the duty correction operations are finished, it may not be possible to correct a distortion of a duty of a clock signal which is input after the duty correction operations are finished.

FIG. 1 is a block diagram of a related-art duty cycle correction circuit.

Referring to FIG. 1, the duty cycle correction circuit includes a correction execution unit 10, a duty detection unit 20, a duty determination unit 30, and a correction code generation unit 40.

The correction execution unit 10 corrects a duty of an input clock signal CLK_d based on a multi-bit correction code DCC_CODE<0:n> to generate a corrected clock signal CLK.

The duty detection unit 20 checks the duty of the corrected clock signal CLK to generate a detection voltage det, which is an analog voltage.

The duty determination unit 30 generates a determination signal con based on the detection voltage det.

For example, the duty determination unit 30 activates the determination signal con when the detection voltage det is larger than a predetermined voltage, and deactivates the determination signal con when the detection voltage det is smaller than the predetermined voltage. The fact that the detection voltage det is larger than the predetermined voltage represents that the duty of the clock signal CLK has been distorted so as not to reach a predetermined level (for example, 60%). Meanwhile, the fact that the detection voltage det is smaller than the predetermined voltage represents that the duty of the clock signal CLK exists within the predetermined level.

The correction code generation unit 40 generates the multi-bit correction code DCC_CODE<0:n> in response to a delay locked signal Lock state, the detection voltage det, and the determination signal con.

The delay locked signal Lock state is activated after the delay locked loop locks a delay value for the clock signal CLK.

When the delay locked signal Lock state and the determination signal con are activated, the correction code generation unit 40 starts an operation of generating the multi-bit correction code DCC_CODE<0:n> based on the detection voltage det, is which is an analog voltage. When the determination signal con is deactivated, the correction code generation unit 40 completes the operation of generating the multi-bit correction code DCC_CODE<0:n> based on the detection voltage.

As described above, the duty cycle correction circuit according to the conventional art is formed in a closed loop as illustrated in FIG. 1, thereby continuously correcting the duty of the clock signal CLK.

SUMMARY

In the following description, certain aspects and embodiments will become evident. It should be understood that these aspects and embodiments are merely exemplary, and the invention, in its broadest sense, could be practiced without having one or more features of these aspects and embodiments.

In one exemplary aspect of the present invention, a semiconductor memory apparatus may comprise a duty cycle correction circuit configured to perform a duty correction operation with respect to an input clock signal when a delay locked signal is activated, and perform the duty correction operation with respect to the input signal when a precharge signal is activated, to generate a corrected clock signal.

In another exemplary aspect of the present invention, a semiconductor memory apparatus may comprise: a delay locked circuit configured to receive an external clock signal to generate an input clock signal by performing a delay locked operation with respect to the external clock signal, and generate a delay locked signal when the delay locked operation is completed; and a duty correction circuit configured to perform a duty correction operation with respect to the input clock signal and generate a corrected clock signal. The duty correction circuit may be configured to perform the duty correction operation when the delay locked signal is activated, and duty correction circuit is further configured to perform the duty correction operation when the precharge signal is activated.

In yet another exemplary aspect of the present invention, a method for correcting a duty of a semiconductor memory apparatus may comprise: receiving an external clock signal; performing a delay locked operation with respect to the external clock signal to generate an input clock signal and activating a delay locked signal; performing a duty correction operation with respect to the input clock signal in response to the delay locked signal and generating a corrected clock signal; activating a precharge signal; and performing the duty correction operation with respect to the input clock signal in response to the precharge signal and generating the corrected clock signal.

In still another exemplary aspect of the present invention, a semiconductor memory apparatus includes a duty cycle correction circuit configured to perform a duty correction operation with respect to an input clock signal in response to a precharge signal to generate a corrected clock signal.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
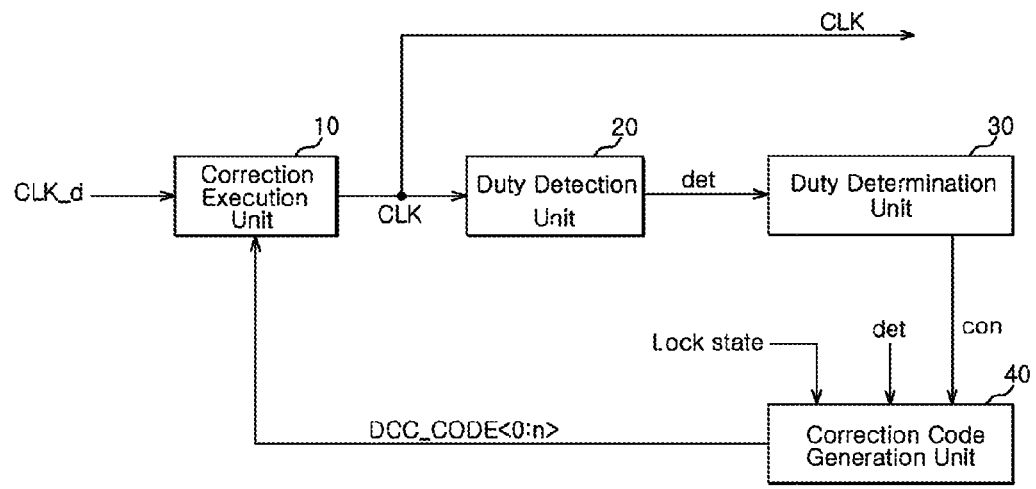
FIG. 1 is a block diagram of a related-art duty cycle correction circuit.

Reference will now be made in detail to the exemplary embodiments consistent with the present disclosure, examples of which are illustrated in the accompanying drawings. Wherever possible, the same reference characters will be used throughout the drawings to refer to the same or like parts.

A duty cycle correction circuit of a semiconductor memory apparatus according to the present invention performs a duty correction operation in response to a delay locked signal Lock state, and additionally performs the duty correction operation for a predetermined time when the semiconductor memory apparatus performs a precharge operation.

A semiconductor memory apparatus according to the present invention can correct the duty of a corrected clock signal CLK throughout a normal operation as well as an initialization operation since the precharge operation is frequently performed in order to preserve stored data when the semiconductor memory apparatus is not performing a read or a write operation.

Figure 2:
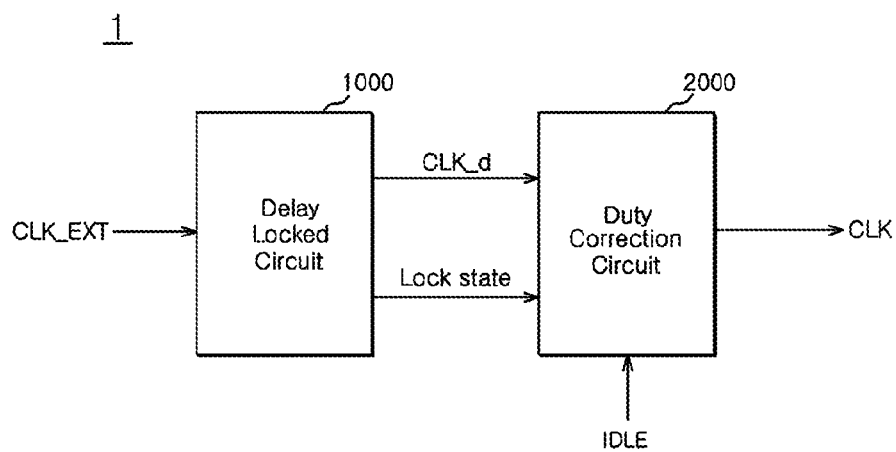
FIG. 2 is a schematic block diagram of a semiconductor memory apparatus including a duty cycle correction circuit according to an exemplary embodiment.

A semiconductor memory apparatus according to the present invention may advantages of high speed and low voltage operations, since a duty of a clock signal is an important factor for stably performing high speed and low voltage operations in a semiconductor memory apparatus, FIG. 2 is a schematic block diagram of a semiconductor memory apparatus 1 including a duty cycle correction circuit according to an exemplary embodiment.

The semiconductor memory apparatus 1 may comprise a delay locked circuit 1000 and a duty correction circuit 2000.

The delay locked circuit 1000 is configured to receive an external clock signal CLK_EXT, perform a delay locked operation with respect to the external clock signal CLK_EXT, and generate an input clock signal CLK_d.

If the delay locked operation is completed, the delay locked circuit 1000 generates a delay locked signal Lock state.

The delay locked circuit 1000 may include a general delay locked loop.

The duty correction circuit 2000 is a duty cycle correction circuit and is configured to generate a corrected clock signal CLK by performing a duty correction operation with respect to the input clock signal CLK_d when the delay locked signal Lock state is activated. The duty correction circuit 2000 generates the corrected clock signal CLK by additionally performing the duty correction operation with respect to the input clock signal CLK_d when a precharge signal IDLE is activated.

Thus, a duty correction operation for the input clock signal CLK_d for generating the corrected clock signal CLK is performed when either the delay locked signal Lock state or the precharge signal IDLE is activated.

The corrected clock signal CLK may be used as an internal clock signal of the semiconductor memory apparatus.

The precharge signal IDLE is activated when a precharge command is generated in the semiconductor memory apparatus 1.

The semiconductor memory apparatus 1 configured as mentioned above performs the duty correction operation in response to the delay locked signal Lock state generated during an initialization operation, thereby initially correcting the duty value of the corrected clock signal CLK. Furthermore, the semiconductor memory apparatus 1 additionally performs the duty correction operation in response to the precharge signal IDLE generated in each precharge operation during the normal operation, thereby additionally correcting the duty value of the corrected clock signal CLK.

In a typical semiconductor memory apparatus, duty distortion after the initialization operation may not be corrected since a duty value set in an initialization operation is continuously maintained. However, in the semiconductor memory apparatus 1 according to an exemplary embodiment, the duty correction operation is performed even in a normal operation, so that it is possible to correct duty distortion after the initialization operation.

In the semiconductor memory apparatus 1 according to the exemplary embodiment, the duty correction operation performed in each precharge operation may be performed in a shorter time than the duty correction operation performed in the initialization operation, in order to reduce power consumption during duty correction. This is because the duty distortion of the external clock signal CLK_EXT which is input in the normal operation is sufficiently smaller than the duty distortion corrected in the initialization operation.

Figure 3:
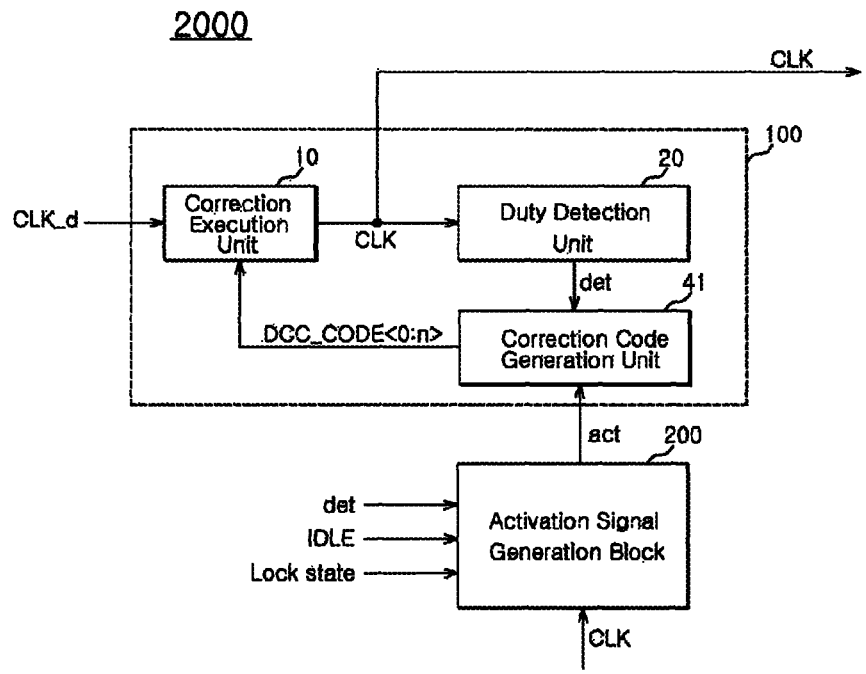
FIG. 3 is a detailed block diagram of the duty correction circuit illustrated in FIG. 2.

FIG. 3 is a detailed block diagram of the duty correction circuit 2000 illustrated in FIG. 2.

Referring to FIG. 3, the duty correction circuit 2000 may comprise a correction block 100 and an activation signal generation block 200.

The correction block 100 is configured to generate a detection voltage det based on the duty of the input clock signal CLK_d, correct the duty of the input clock signal CLK_d in response to an activation signal act, and generate the corrected clock signal CLK.

The correction block 100 may comprise a correction execution unit 10, a duty detection unit 20, and a correction code generation unit 41.

The correction execution unit 10 is configured to correct the duty of the input clock signal CLK_d based on the multi-bit correction code DCC_CODE<0:n> and generate the corrected clock signal CLK. Furthermore, the correction execution unit 10 is configured to provide the duty detection unit 20 with the corrected clock signal CLK.

The correction execution unit 10 may have a substantially same configuration as that of the general correction execution unit 10 illustrated in FIG. 1.

The duty detection unit 20 is configured to check the duty of the corrected clock signal CLK and generate a detection voltage det which is an analog voltage.

For example, the duty detection unit 20 may be configured to check the duty of the corrected clock signal CLK and generate a low detection voltage det as the duty approaches 50%.

The duty detection unit 20 may have a substantially same configuration as that of the general duty detection unit 20 illustrated in FIG. 1.

The correction code generation unit 41 is configured to generate the multi-bit correction code DCC_CODE<0:n> based on the detection voltage det when the activation signal act is activated.

The correction code generation unit 41 may comprise general voltage divider, comparator and counter circuit, which are activated based on the activation signal act.

The activation signal generation block 200 is configured to generate the activation signal act based on the delay locked signal Lock state, the precharge signal IDLE, and the detection voltage det.

For example, the activation signal generation block 200 activates the activation signal act based on the detection voltage det when the delay locked signal Lock state is activated, and also activates the activation signal act when the precharge signal IDLE is activated.

The activation signal generation block 200 configured as mentioned above performs the duty correction operation with respect to the input clock signal CLK_d until the duty of the corrected clock signal CLK reaches a predetermined level and the detection voltage det falls below a predetermined level when the delay locked signal Lock state is activated.

Furthermore, the activation signal generation block 200 may additionally perform the duty correction operation for a predetermined time when the precharge signal IDLE is activated.

Figure 4:
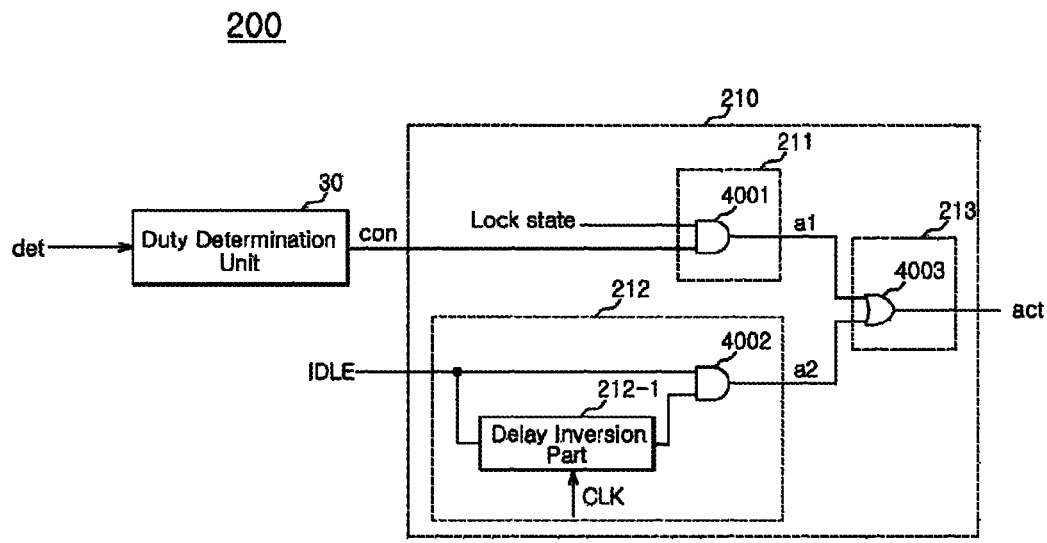
FIG. 4 is a circuit diagram of the activation signal generation block illustrated in FIG. 3 according to an exemplary embodiment.

FIG. 4 is a circuit diagram of the activation signal generation block 200 illustrated in FIG. 3 according to an exemplary embodiment.

The activation signal generation block 200 may comprise a duty determination unit 30 and a signal combination unit 210.

The duty determination unit 30 is configured to generate a determination signal con based on the detection voltage det.

For example, the duty determination unit 30 may be configured to activate the determination signal con when the detection voltage det is larger than a predetermined voltage, and deactivate the determination signal con when the detection voltage det is smaller than the predetermined voltage.

The duty determination unit 30 may have a substantially same configuration as that of the duty determination unit 30 illustrated in FIG. 1. For example, the duty determination unit 30 may comprise a general comparator.

The signal combination unit 210 is configured to generate the activation signal act in response to the precharge signal IDLE, the delay locked signal Lock state, and the determination signal con.

The signal combination unit 210 may be configured to activate the activation signal act when both the delay locked signal Lock state and the determination signal con are activated, and additionally activate the activation signal act when the precharge signal IDLE is activated.

The signal combination unit 210 may comprise a first activation section 211, a second activation section 212, and an adding section 213.

The first activation section 211 is configured to generate a first activation period signal a1 which is activated during the period in which the delay locked signal Lock state and the determination signal con are activated.

The first activation section 211 may comprise an AND gate 4001.

The AND gate 4001 is configured to perform an AND operation on the delay locked signal Lock state and the determination signal con and output the first activation period signal a1.

The second activation section 212 is configured to generate a second activation period signal a2 with a predetermined pulse width when the precharge signal IDLE is activated.

The precharge signal IDLE is activated in response to a precharge command and the pulse width thereof may be insufficient to be used for the duty correction operation of the duty correction circuit 2000. Therefore, the second activation section 212 illustrated in FIG. 4 is configured to convert the precharge signal IDLE to a signal with a pulse width sufficient for the duty correction operation.

The second activation section 212 may comprise a delay inversion part 212-1 and an AND gate 4002.

The delay inversion part 212-1 is configured to delay and invert the precharge signal IDLE for a predetermined time and output an inverted signal.

The AND gate 4002 is configured to perform an AND operation on the precharge signal IDLE and the output signal of the delay inversion part 212-1 and output the second activation period signal a2.

The second activation section 212 configured as mentioned above may generate the second activation period signal a2 with a pulse width corresponding to the delay time of the delay inversion part 212-1.

The adding section 213 is configured to add the first activation period signal a1 to the second activation period signal a2 and generate the activation signal act.

The signal combination unit 210 configured as illustrated in FIG. 4 may generate the activation signal act having a period in which the delay locked signal Lock state and the determination signal con have been activated, and a period activated for a predetermined time from the time point at which the precharge signal IDLE has been activated.

The delay inversion part 212-1 may comprise a general delay circuit and an inverter.

Furthermore, the delay inversion part 212-1 may comprise a delay flip-flop that receives the corrected clock signal CLK or the external clock signal CLK_EXT. When the delay inversion part 212-1 includes the delay flip-flop, the delay time of the delay inversion part 212-1 may synchronize with the corrected clock signal CLK. Since the semiconductor memory apparatus 1 operates in synchronization with the corrected clock signal CLK, the synchronization with the corrected clock signal CLK without the delay time of the delay inversion part 212-1 may be advantageous in dealing with a change in the operation characteristics of the semiconductor memory apparatus 1.

Figure 5:
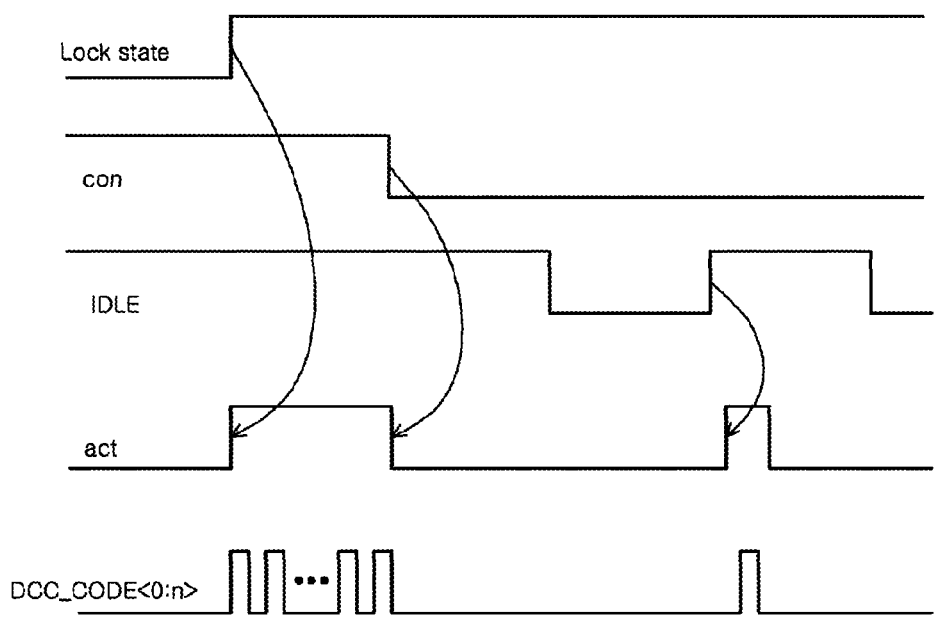
FIG. 5 is a waveform diagram illustrating the operation of the duty correction circuit illustrated in FIGS. 2 to 4.

FIG. 5 is a waveform diagram illustrating the operation of the duty correction circuit 2000 illustrated in FIGS. 2 to 4.

Referring to FIG. 5, the delay locked operation of the delay locked circuit 1000 is completed and the delay locked signal Lock state is activated to a high level.

The duty detection unit 20 checks the duty of the corrected clock signal CLK and outputs the detection voltage det.

Furthermore, the duty determination unit 30 checks that the detection voltage det is equal to or more than a predetermined level and activates the determination signal con to a high level as illustrated in FIG. 5. This represents that the duty of the corrected clock signal CLK has not reached a predetermined level. In general, the ideal duty of the corrected clock signal CLK is 50%.

The precharge signal IDLE maintains a high level state according to the initialization operation of the semiconductor memory apparatus 1.

Thus, as illustrated in FIG. 5, the signal combination unit 210 activates the activation signal act to a high level in response to the activation to high levels of the delay locked signal Lock state and the determination signal con. That is, the activation signal act is activated for during the period in which the delay locked signal Lock state and the determination signal con are at high levels.

The correction code generation unit 41 generates the multi-bit correction code DCC_CODE<0:n> based on the detection voltage det in response to the activation signal act.

As illustrated in FIG. 5, the multi-bit correction code DCC_CODE<0:n> is generated by the correction code generation unit 41 multiple times during the period in which the activation signal act is activated.

As the multi-bit correction code DCC_CODE<0:n> is generated multiple times, the correction execution unit 10 performs the duty correction operation with respect to the corrected clock signal CLK multiple times. As the degree of the correction for the duty of the corrected clock signal CLK approaches the predetermined level (for example, 50%), the level of the detection voltage det generated by the duty detection unit 20 falls.

Referring to FIG. 5, as the detection voltage det falls below the predetermined level, the duty determination unit 30 deactivates the determination signal con to a low level.

Furthermore, as the determination signal con is deactivated to the low level, the activation signal act is deactivated to a low level by the signal combination unit 210.

As the activation signal act is deactivated, the correction code generation unit 41 stops generating the multi-bit correction code DCC_CODE<0:n>.

Then, the semiconductor memory apparatus 1 completes the initialization operation and starts the normal operation.

In the normal operation of the semiconductor memory apparatus 1, the precharge signal IDLE is activated to a high level in response to the precharge command.

FIG. 5 illustrates that the activation signal act is activated by the signal combination unit 210 for a predetermined time as the precharge signal IDLE is activated to the high level.

Thus, the correction code generation unit 41 generates the multi-bit correction code DCC_CODE<0:n> based on the detection voltage det in response to the activation signal act.

As described above, the duty correction operation performed in response to the precharge signal IDLE may be performed for a shorter time than the duty correction operation performed in response to the delay locked signal Lock state.

As illustrated in FIG. 5, during the activation period of the activation signal act activated in response to the precharge signal IDLE, the multi-bit correction code DCC_CODE<0:n> is generated once without being limited by the correction code generation unit 41.

Figure 6:
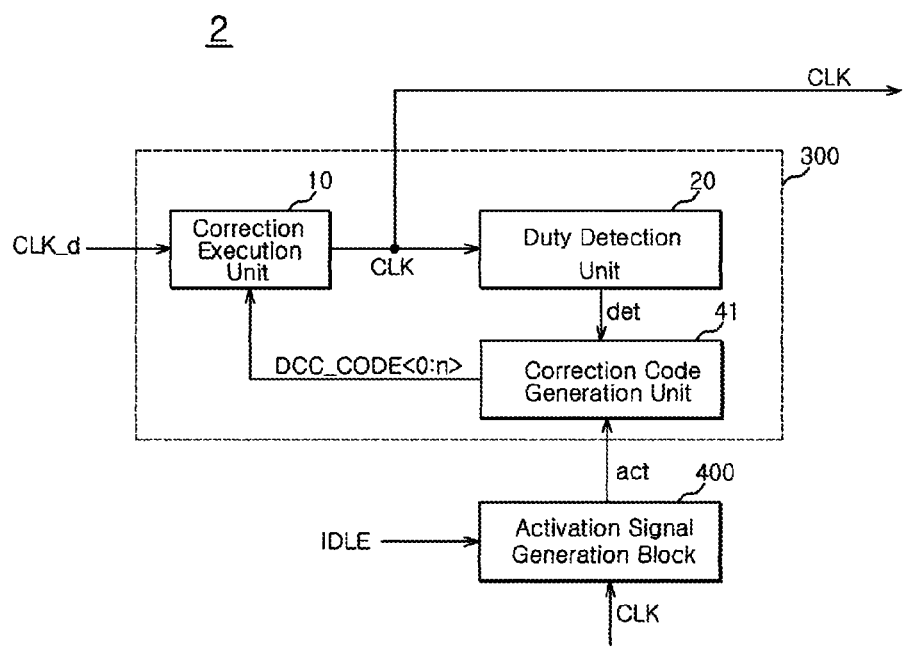
FIG. 6 is a schematic block diagram of a semiconductor memory apparatus including a duty cycle correction circuit according to an exemplary embodiment.

FIG. 6 is a schematic block diagram of a semiconductor memory apparatus 2 including a duty cycle correction circuit according to another exemplary embodiment.

The semiconductor memory apparatus 2 illustrated in FIGS. 2 to 5 is configured to perform the duty correction operation after the delay locked operation of the delay locked circuit 1000 and in the precharge operation.

However, the semiconductor memory apparatus 2 illustrated in FIG. 6 is configured to not perform the duty correction operation after the delay locked operation of the delay locked circuit 1000, and to perform the duty correction operation in the precharge operation.

The semiconductor memory apparatus 2 does not perform the duty correction operation after the delay locked operation of the delay locked circuit 1000, so that it is possible to reduce the time necessary for the initialization operation of the semiconductor memory apparatus 2.

Consequently, the semiconductor memory apparatus 2 illustrated in FIG. 6 is sufficient to be used for a semiconductor memory apparatus with no delay locked loop.

The duty cycle correction circuit of the semiconductor memory apparatus 2 illustrated in FIG. 6 may comprise a correction block 300 and an activation signal generation block 400.

The correction block 300 is configured to perform a duty correction operation with respect to an input clock signal CLK_d in response to an activation signal act, and generate a corrected clock signal CLK.

The activation signal generation block 400 is configured to generate the activation signal act in response to a precharge signal IDLE.

The correction block 300 may comprise a correction execution unit 10, a duty detection unit 20, and a correction code generation unit 41.

The correction execution unit 10 is configured to perform the duty correction operation with respect to the input clock signal CLK_d based on the multi-bit correction code DCC_CODE<0:n> and generate the corrected clock signal CLK. Furthermore, the correction execution unit 10 is configured to provide the duty detection unit 20 with the corrected clock signal CLK.

The correction execution unit 10 may have a substantially same configuration as that of the general correction execution unit 10 illustrated in FIGS. 1 and 3.

The duty detection unit 20 is configured to check the duty of the corrected clock signal CLK and generate a detection voltage det which is an analog voltage.

For example, the duty detection unit 20 may be configured to check the duty of the corrected clock signal CLK and generate a low detection voltage det as the duty approaches 50%.

The duty detection unit 20 may have a substantially same configuration as that of the general duty detection unit 20 illustrated in FIGS. 1 and 3.

The correction code generation unit 41 is configured to generate the multi-bit correction code DCC_CODE<0:n> based on the detection voltage det when the activation signal act is activated.

The correction code generation unit 41 may include general voltage divider and counter circuit, which are activated based on the activation signal act.

In the duty cycle correction circuit configured as illustrated in FIG. 6, the activation signal generation block 400 is configured to activate and output the activation signal act whenever the precharge signal IDLE is activated.

Thus, the correction code generation unit 41 generates the multi-bit correction code DCC_CODE<0:n> in response to the activation signal act whenever the precharge signal IDLE is activated.

Furthermore, the correction execution unit 10 performs the duty correction operation with respect to the input clock signal CLK_d in response to the multi-bit correction code DCC_CODE<0:n> whenever the precharge signal IDLE is activated.

Figure 7:
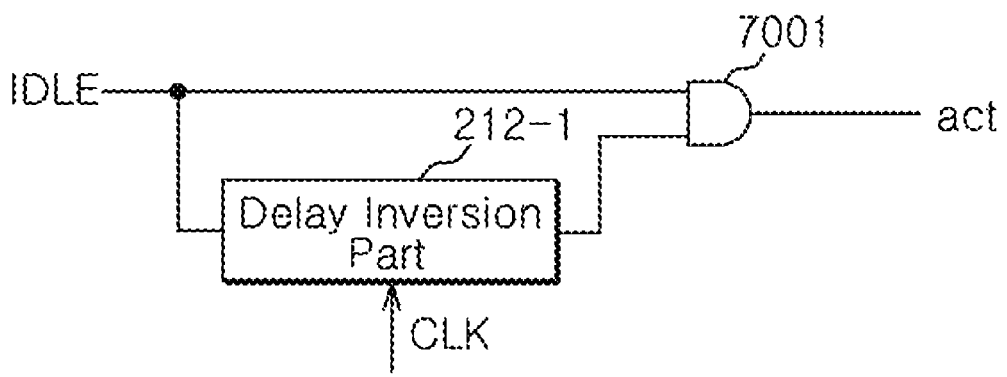
FIG. 7 is a circuit diagram of the activation signal generation block illustrated in FIG. 6 according to an exemplary embodiment.

FIG. 7 is a circuit diagram of the activation signal generation block 400 illustrated in FIG. 6 according to another exemplary embodiment.

The activation signal generation block 400 may have a configuration similar to that of the second activation section 212 illustrated in FIG. 4.

The activation signal generation block 400 may comprise a delay inversion part 212-1 and an AND gate 7001.

The delay inversion part 212-1 is configured to delay and invert the precharge signal IDLE for a predetermined time and output an inverted signal. The delay inversion part 212-1 may have a substantially same configuration as that of the delay inversion part 212-1 illustrated in FIG. 4.

The AND gate 7001 is configured to perform an AND operation on the precharge signal IDLE and the output signal of the delay inversion part 212-1 and output the activation signal act.

The activation signal generation block 400 configured as mentioned above may generate the activation signal act with a pulse width corresponding to the delay time of the delay inversion part 212-1.

While certain embodiments have been described above, it will be understood to those skilled in the art that the embodiments described are by way of example only. Accordingly, the semiconductor memory apparatus and the method for correcting the duty thereof described herein should not be limited based on the described embodiments. Rather, the semiconductor memory apparatus and the method for correcting the duty thereof described herein should only be limited in light of the claims that follow when taken in conjunction with the above description and accompanying drawings.

What is claimed is:

1. A semiconductor memory apparatus comprising:
   a duty cycle correction circuit configured to perform a duty correction operation with respect to an input clock signal when a delay locked signal is activated, and perform the duty correction operation with respect to the input clock signal when a precharge signal is activated, to generate a corrected clock signal,
   wherein the duty cycle correction circuit comprises:
   a correction block configured to perform the duty correction operation with respect to the input clock signal based on an activation signal to generate the corrected clock signal, and generate a detection voltage based on a duty of the corrected clock signal; and
   an activation signal generation block configured to generate the activation signal based on the delay locked signal, the precharge signal and the detection voltage.

2. The semiconductor memory apparatus according to claim 1, wherein the correction block comprises:
   a correction execution unit configured to perform the duty correction operation with respect to the input clock signal based on a correction code and generate the corrected clock signal;
   a duty detection unit configured to generate the detection voltage based on the duty of the corrected clock signal; and
   a correction code generation unit configured to generate the correction code based on the detection voltage in response to the activation signal.

3. The semiconductor memory apparatus according to claim 1, wherein the activation signal generation block is configured to activate the activation signal based on the detection voltage when the delay locked signal is activated, and additionally activate the activation signal when the precharge signal is activated.

4. The semiconductor memory apparatus according to claim 3, wherein the activation signal generation block comprises:
   a duty determination unit configured to generate a determination signal based on the detection voltage; and
   a signal combination unit configured to generate the activation signal in response to the precharge signal, the delay locked signal, and the determination signal.

5. The semiconductor memory apparatus according to claim 4, wherein the signal combination unit is configured to activate and output the activation signal when at least one of the delay locked signal, the precharge signal and the determination signal is activated.

6. The semiconductor memory apparatus according to claim 5, wherein the signal combination unit comprises:
   a first activation section configured to generate a first activation period signal which is activated during a period in which both a delay locked signal and the determination signal are activated;
   a second activation section configured to activate a second activation period signal with a predetermined pulse width when the precharge signal is activated; and
   an adding section configured to add the first activation period signal to the second activation period signal and generate the activation signal.

7. The semiconductor memory apparatus according to claim 6, wherein the second activation section is configured to allow the second activation period signal to have a predetermined pulse width using a pulse width of the clock signal.

8. The semiconductor memory apparatus according to claim 6, wherein the predetermined pulse width corresponds to a time necessary for the correction code generation unit to generate the correction code once.

9. The semiconductor memory apparatus according to claim 1, wherein a time necessary to perform the duty correction operation when the precharge signal is activated is shorter than a time necessary to perform the duty correction operation when the delay locked signal is activated.

10. A semiconductor memory apparatus comprising:
    a delay locked circuit configured to receive an external clock signal to generate an input clock signal by performing a delay locked operation with respect to the external clock signal, and generate a delay locked signal when the delay locked operation is completed; and
    a duty correction circuit configured to perform a duty correction operation with respect to the input clock signal and generate a corrected clock signal when any one of the delay locked signal and a precharge signal is activated, wherein a time necessary to perform the duty correction operation when the precharge signal is activated is shorter than a time necessary to perform the duty correction operation when the delay locked signal is activated.

11. The semiconductor memory apparatus according to claim 10, wherein the duty correction circuit comprises:

a correction block configured to perform the duty correction operation with respect to the input clock signal based on an activation signal to generate the corrected clock signal, and generate a detection voltage based on a duty of the corrected clock signal; and an activation signal generation block configured to generate the activation signal based on the delay locked signal, the precharge signal, and the detection voltage.

12. The semiconductor memory apparatus according to claim 11, wherein the correction block comprises:

a correction execution unit configured to correct a duty of the clock signal based on a correction code;

a duty detection unit configured to generate a detection voltage based on the duty of the clock signal; and a correction code generation unit configured to generate the correction code based on the detection voltage in response to the activation signal.

13. The semiconductor memory apparatus according to claim 11, wherein the activation signal generation block is configured to activate the activation signal based on the detection voltage when the delay locked signal is activated, and additionally activate the activation signal when the precharge signal is activated.

14. The semiconductor memory apparatus according to claim 13, wherein the activation signal generation block comprises:

a duty determination unit configured to generate a determination signal based on the detection voltage; and a signal combination unit configured to generate the activation signal in response to the precharge signal, the delay locked signal, and the determination signal.

15. The semiconductor memory apparatus according to claim 14, wherein the signal combination unit is configured to activate and output the activation signal when at least one of the delay locked signal, the determination signal, or the precharge signal is activated.

16. The semiconductor memory apparatus according to claim 15, wherein the signal combination unit comprises:

a first activation section configured to generate a first activation period signal which is activated during a period in which the delay locked signal and the determination signal are activated;

a second activation section configured to activate a second activation period signal with a predetermined pulse width when the precharge signal is activated; and an adding section configured to add the first activation period signal to the second activation period signal and generate the activation signal.

17. The semiconductor memory apparatus according to claim 15, wherein the second activation section is configured to allow the second activation period signal to have a predetermined pulse width using a pulse width of the clock signal.

18. The semiconductor memory apparatus according to claim 16, wherein the predetermined pulse width corresponds to a time necessary for the correction code generation unit to generate the correction code once.

19. A method for correcting a duty of a semiconductor memory apparatus, comprising:

receiving an external clock signal;

performing a delay locked operation with respect to the external clock signal to generate an input clock signal and activating a delay locked signal;

performing a duty correction operation with respect to the input clock signal in response to the delay locked signal and generating a corrected clock signal;

activating a precharge signal; and performing the duty correction operation with respect to the input clock signal in response to the precharge signal and generating the corrected clock signal, wherein the performing the duty correction operation with respect to the input clock signal in response to the delay locked signal is performed n times until a duty of the input clock signal is corrected to a predetermined level, and the performing the duty correction operation with respect to the input clock signal in response to the precharge signal is performed m times, wherein the m is an integer larger than 1 and the n is an integer larger than the m.

20. A semiconductor memory apparatus comprising:

a duty cycle correction circuit configured to perform a duty correction operation with respect to an input clock signal in response to a precharge signal to generate a corrected clock signal, wherein the duty cycle correction circuit comprises:

a correction block configured to perform the duty correction operation with respect to the input clock signal in response to an activation signal and generate the corrected clock signal; and an activation signal generation block configured to generate the activation signal in response to the precharge signal.

21. The semiconductor memory apparatus according to claim 20, wherein the correction block comprises:

a correction execution unit configured to perform the duty correction operation with respect to the input clock signal based on a correction code and generate the corrected clock signal;

a duty detection unit configured to generate a detection voltage based on a duty of the clock signal; and a correction code generation unit configured to generate the correction code based on the detection voltage in response to the activation signal.

22. The semiconductor memory apparatus according to claim 20, wherein the activation signal generation block is configured to generate the activation signal with a predetermined pulse width when the precharge signal is activated.

23. The semiconductor memory apparatus according to claim 22, wherein the activation signal generation block is configured to allow the activation signal to have a predetermined pulse width using a pulse width of the clock signal.

* * * * *